US009059138B2

(12) United States Patent
Camillo-Castillo et al.

(10) Patent No.: US 9,059,138 B2
(45) Date of Patent: Jun. 16, 2015

(54) HETEROJUNCTION BIPOLAR TRANSISTOR WITH REDUCED SUB-COLLECTOR LENGTH, METHOD OF MANUFACTURE AND DESIGN STRUCTURE

(75) Inventors: Renata Camillo-Castillo, Essex Junction, VT (US); Zhong-Xiang He, Essex Junction, VT (US); Jeffrey B. Johnson, Essex Junction, VT (US); Qizhi Liu, Lexington, MA (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 13/358,180

(22) Filed: Jan. 25, 2012

(65) Prior Publication Data

US 2013/0187198 A1     Jul. 25, 2013

(51) Int. Cl.
| | |
|---|---|
| *H01L 29/737* | (2006.01) |
| *G06F 17/50* | (2006.01) |
| *H01L 21/331* | (2006.01) |
| *H01L 29/417* | (2006.01) |
| *H01L 29/66* | (2006.01) |
| *H01L 29/10* | (2006.01) |

(52) U.S. Cl.
CPC ........ *H01L 29/417* (2013.01); *H01L 29/66242* (2013.01); *H01L 29/7371* (2013.01); *H01L 29/1004* (2013.01)

(58) Field of Classification Search
CPC .............. H01L 29/1004; H01L 29/417; H01L 29/66242; H01L 29/7371
USPC ............ 257/E21.371, E29.188, 197; 438/312
See application file for complete search history.

(56) References Cited

U.S. PATENT DOCUMENTS

| | | | |
|---|---|---|---|
| 4,749,661 | A | 6/1988 | Bower |
| 4,758,528 | A | 7/1988 | Goth et al. |

(Continued)

FOREIGN PATENT DOCUMENTS

EP         483487 A1 *   5/1992  ............. H01L 29/10

OTHER PUBLICATIONS

Lee, Q. et al., "A >400 GHz fmax Transferred-Substrate Heterojunction Bipolar Transistor IC Technology," IEEE Electron Device Letters, May 1997, vol. 18, No. 5, IEEE.

*Primary Examiner* — Ermias Woldegeorgis
*Assistant Examiner* — Benjamin Tzu-Hung Liu
(74) *Attorney, Agent, or Firm* — Arnold B. Bangali; Anthony J. Canale

(57) ABSTRACT

A heterojunction bipolar transistor (HBT) structure, method of manufacturing the same and design structure thereof are provided. The HBT structure includes a semiconductor substrate having a sub-collector region therein. The HBT structure further includes a collector region overlying a portion of the sub-collector region. The HBT structure further includes an intrinsic base layer overlying at least a portion of the collector region. The HBT structure further includes an extrinsic base layer adjacent to and electrically connected to the intrinsic base layer. The HBT structure further includes an isolation region extending vertically between the extrinsic base layer and the sub-collector region. The HBT structure further includes an emitter overlying a portion of the intrinsic base layer. The HBT structure further includes a collector contact electrically connected to the sub-collector region. The collector contact advantageously extends through at least a portion of the extrinsic base layer.

20 Claims, 12 Drawing Sheets

(56) References Cited

U.S. PATENT DOCUMENTS

| | | | |
|---|---|---|---|
| 5,010,039 A | 4/1991 | Ku et al. | |
| 5,109,262 A | 4/1992 | Kadota et al. | |
| 5,177,582 A | 1/1993 | Meister et al. | |
| 5,358,884 A | 10/1994 | Violette | |
| 5,445,976 A | 8/1995 | Henderson et al. | |
| 5,665,614 A | 9/1997 | Hafizi et al. | |
| 6,232,638 B1 | 5/2001 | Suzuki | |
| 6,271,097 B1 * | 8/2001 | Morris | 438/312 |
| 6,337,494 B1 * | 1/2002 | Ryum et al. | 257/197 |
| 6,812,545 B2 | 11/2004 | Dunn et al. | |
| 6,894,362 B2 * | 5/2005 | Malik | 257/508 |
| 6,956,266 B1 | 10/2005 | Voldman et al. | |
| 7,002,221 B2 | 2/2006 | Khater et al. | |
| 7,364,977 B2 | 4/2008 | Min et al. | |
| 7,491,632 B2 | 2/2009 | Coolbaugh et al. | |
| 7,622,357 B2 | 11/2009 | Vaed et al. | |
| 7,670,889 B2 * | 3/2010 | Pekarik et al. | 438/186 |
| 7,679,164 B2 * | 3/2010 | Pagette et al. | 257/576 |
| 7,709,930 B2 | 5/2010 | Stricker et al. | |
| 7,755,161 B2 | 7/2010 | Liu et al. | |
| 7,829,917 B1 | 11/2010 | Thomas | |
| 7,943,514 B2 | 5/2011 | West | |
| 2005/0151225 A1 | 7/2005 | Adam et al. | |
| 2007/0205430 A1 | 9/2007 | Collins et al. | |
| 2009/0001417 A1 * | 1/2009 | Liu et al. | 257/190 |
| 2011/0299327 A1 * | 12/2011 | Asa | 365/156 |

* cited by examiner

HETEROJUNCTION BIPOLAR TRANSISTOR WITH REDUCED SUB-COLLECTOR LENGTH, METHOD OF MANUFACTURE AND DESIGN STRUCTURE

BACKGROUND

Field of the Invention

The present invention relates to bipolar transistor, and more particularly, to heterojunction bipolar transistor (HBT) with reduced sub-collector length, method of manufacturing the same and design structure thereof.

A bipolar junction transistor usually includes two back-to-back p-n junctions that share a thin common region. In other words, a bipolar junction transistor typically includes three regions, two outer regions commonly known as "emitter" and "collector" respectively, and a middle region commonly known as "base". Electrical connections are generally made to all three regions.

A heterojunction bipolar transistor (HBT) is a bipolar junction transistor that employs at least two different kinds of semiconductor materials. By virtue of this difference in material, energy band-gaps, as well as other material related properties, may be made different for regions of emitter, base and collector of the HBT. In addition, a gradual change of semiconductor material, also known as grading, may also be possible inside one or more of the regions. The use of heterojunction provides an added degree of freedom in design, which often results in improved performance, when being compared with its homojunction counterpart.

Improvement in transistor performance, especially its operation speed, is generally considered as essential for achieving improved performance of an integrated circuit wherein various types of transistors are normally used. Bipolar transistors with a silicon germanium ("SiGe") intrinsic base may be capable of delivering performance required for such integrated circuit. To achieve higher electrical performance, these transistors typically have a doped polysilicon extrinsic base layer on top of or adjacent to the epitaxy grown intrinsic SiGe base, known in the art as a raised extrinsic base. So far, SiGe-HBTs with a raised extrinsic base have demonstrated cut-off frequency ($f_T$) of up to 400 GHz. The emitter to collector transit time of such a transistor is typically reduced by optimizing the Ge/Si ratio, doping profile, and film thickness of the epitaxy grown intrinsic SiGe base. Such devices are used, for example, in integrated circuits fabricated for high performance mixed signal applications.

Collector base capacitance also typically influences the maximum operating frequency ($f_{max}$). As other parameters of a HBT improve, parasitic collector base capacitance ($C_{cb}$) of the HBT is increasingly becoming a limiting factor for the device performance. High collector base capacitance $C_{cb}$ may limit cut-off frequency $f_T$, the impact of which may be measured, as is well known in the art, as a function of base transit time and collector space-charge transit time. The switching speed of a circuit is typically directly controlled by $f_T$ of the HBT device. Thus, a lowered $f_T$ may ultimately limit the maximum operating frequency $f_{max}$ of the HBT device.

Accordingly, it is desirable to provide an HBT structure and method by which $f_T$ is significantly increased.

SUMMARY

In an aspect of the invention, a heterojunction bipolar transistor structure comprises a semiconductor substrate having a sub-collector region of a first conductivity type therein. The HBT structure further comprises a collector region of a first conductivity type overlying a portion of the sub-collector region. The collector region has lower impurity concentration than the sub-collector region. The HBT structure further comprises an intrinsic base layer of a second conductivity type overlying at least a portion of the collector region. The HBT structure further comprises an extrinsic base layer adjacent to and electrically connected to the intrinsic base layer. The HBT structure further comprises an isolation region extending vertically between the extrinsic base layer and the sub-collector region. The HBT structure further comprises an emitter of the first conductivity type overlying a portion of the intrinsic base layer. The HBT structure further comprises a collector contact electrically connected to the sub-collector region. The collector contact extends through at least a portion of the extrinsic base layer.

In another aspect of the invention, a method for fabricating a heterojunction bipolar transistor structure comprises forming a sub-collector region of a first conductivity type within a semiconductor substrate. The method further comprises forming a collector region of a first conductivity type in the semiconductor substrate. The collector region overlies a portion of the sub-collector region and has a lower impurity concentration than the sub-collector region. The method further comprises forming an isolation region substantially around the collector region and substantially around at least a portion of the sub-collector region. The method further comprises forming an intrinsic base layer of a second conductivity type above at least a portion of the collector region. The method further comprises forming an extrinsic base layer adjacent to the intrinsic base layer. The extrinsic base layer is electrically connected to the intrinsic base layer. The method further comprises forming an emitter of the first conductivity type above a portion of the intrinsic base layer. The method further comprises forming a collector contact. The collector contact is electrically connected to the sub-collector region. The collector contact extends through at least a portion of the extrinsic base layer.

In another aspect of the invention, a design structure embodied in a machine readable medium for designing, manufacturing, or testing an integrated circuit is provided. The design structure comprises the structures and/or methods of the present invention.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

Figure 1:
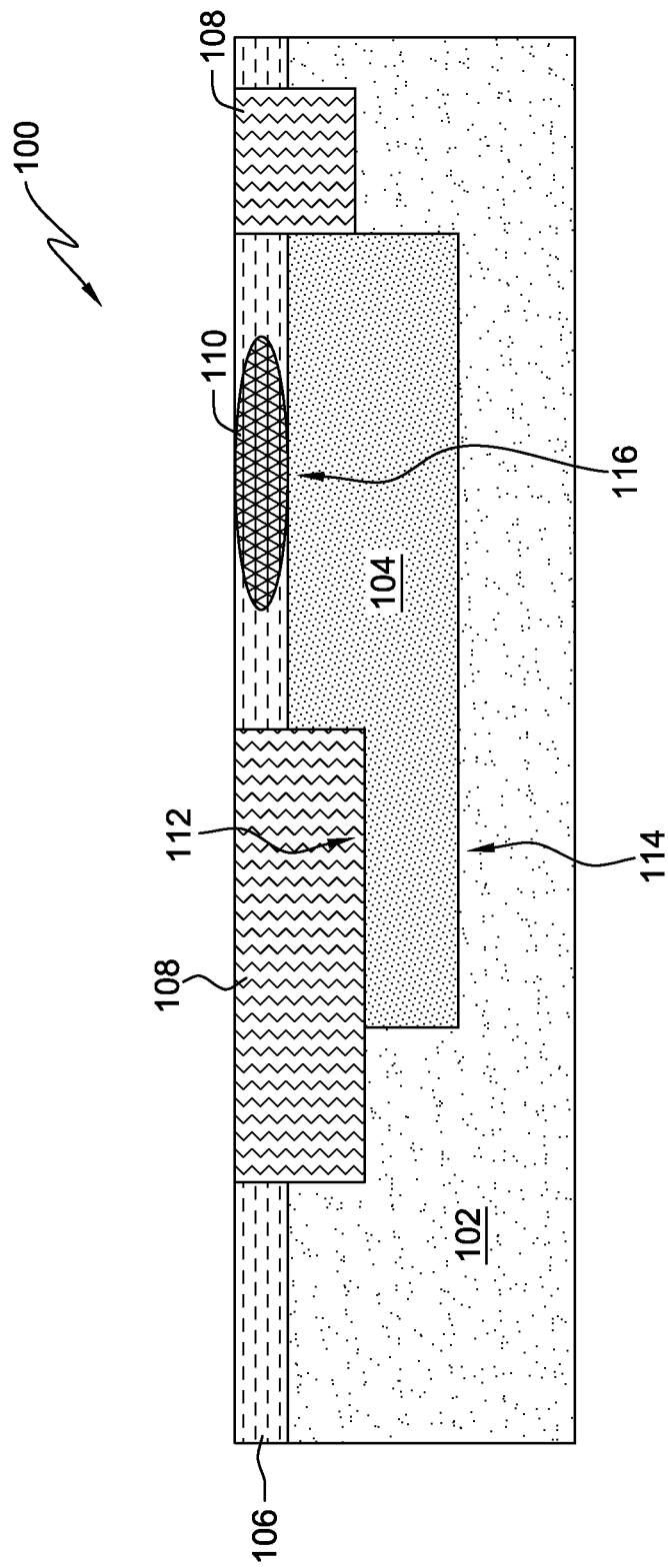
FIGS. 1 through 9 schematically illustrate method steps for fabrication of a heterojunction bipolar transistor in accordance with an embodiment of the disclosure.

The present invention relates to a structure and method of forming a heterojunction bipolar transistor (HBT). More specifically, the present invention comprises a heterojunction bipolar transistor structure having a sub-collector region of a first conductivity type formed in a semiconductor substrate. The HBT structure further comprises a collector region of a first conductivity type overlying a portion of the sub-collector region. The collector region has lower impurity concentration than the sub-collector region. The HBT structure further comprises an intrinsic base layer of a second conductivity type overlying at least a portion of the collector region. The HBT structure further comprises an extrinsic base layer adjacent to and electrically connected to the intrinsic base layer. The HBT structure further comprises an isolation region extending vertically between the extrinsic base layer and the sub-collector region. The HBT structure further comprises an emitter of the first conductivity type overlying a portion of the intrinsic base layer. The HBT structure further comprises a collector contact electrically connected to the sub-collector region. The collector contact extends through at least a portion of the extrinsic base layer. Advantageously, the structure of disclosed embodiments of the present invention is an improvement over prior art as it allows one to reduce the length of the sub-collector region in order to increase a cut-off frequency and to reduce a parasitic capacitance of an HBT device and, consequently, to improve performance of the device.

FIGS. 1 through 9 schematically illustrate method steps for fabrication of a heterojunction bipolar transistor structure in accordance with an embodiment of the invention. For convenience, when the discussion of the fabrication steps of the present invention refers to a particular type of substrate and/or particular type of dopant impurities, it is understood that the present invention is applicable to the opposite type substrate without departing from the spirit of the present invention. For instance, when reference is made to a p-type silicon substrate as the semiconductive substrate and n-type impurities as diffused or implanted dopant impurity, it is understood that an n-type substrate and p-type diffused or implanted dopant impurities are likewise suitable. In addition, it is understood that when the discussion refers to n-type impurities, the process steps are applicable to p-type impurities and vice versa. Also, when reference is made to impurities of a "first type" and to impurities of a "second type," it is understood that the "first type" refers to an n-type or p-type impurities and "second type" refers to the opposite conductivity type. That is, if the "first type" is p, then the "second type" is n. If the "first type" is n, then the "second type" is p. However, once a convention is selected for manufacturing of a bipolar transistor, the convention must be maintained. That is, either all first type dopants must be N doped and all second type dopants P doped, or all first type dopants must be P doped and all second type dopants N doped.

In the following sections, for the ease of description, structures of the semiconductor device illustrated in FIGS. 1 through 9 may be referred to as HBT 100 in general, even though some of the drawings may only illustrate a part of HBT 100, or in other words, a work-in-progress HBT 100. A completed HBT 100 is demonstratively illustrated in FIG. 9.

According to an embodiment, a process and/or method of fabrication may start with a semiconductor wafer 102 as shown in FIG. 1. Semiconductor wafer 102 may be any type of wafers of suitable semiconductor material. Preferably, the initial wafer is a single crystal silicon wafer. Semiconductor wafer 102 may be of a p-type lightly doped semiconductor substrate, as is well known in the art. Semiconductor substrate 102 may have a dopant concentration from approximately $10^{14}$ atoms per $cm^3$ to approximately $10^{17}$ atoms per $cm^3$.

The present embodiment of a method of fabrication may include forming a buried sub-collector region 104, as shown in FIG. 1. At least one mask material (not shown) may be formed via a conventional deposition process on the surface of semiconductor substrate 102. After forming at least one mask material on the surface of semiconductor substrate 102, the at least one material may be patterned by lithography and optionally etching. The patterned mask protects some portions of semiconductor substrate 102, while leaving at least one other portion of semiconductor substrate 102 exposed. It is at the exposed portion(s) of semiconductor substrate 102 where the dopant ions are introduced thus forming buried sub-collector region 104 in selected areas of semiconductor substrate 102. In an embodiment, buried sub-collector region 104 may be formed using a reduced implant energy at a relatively high dose, as is well-known in the art. Buried sub-collector region 104 may have a dopant (n-type) concentration from approximately $10^{18}$ atoms per $cm^3$ to approximately $10^{21}$ atoms per $cm^3$.

Still referring to FIG. 1, an epitaxial layer 106 may be deposited or grown on top of the semiconductor substrate 102, including buried sub-collector region 104, to form active region of HBT 100. Epitaxial layer 106 may be deposited or grown by means known in the art. For example, epitaxial layer 106 may be grown at 1000° C. Epitaxial layer 106 may be doped in-situ with an n-type type dopant. In-situ doping refers to the doping technique wherein the dopants are introduced to the epitaxial layer 106 at the same time epitaxial layer 106 is being deposited or grown. In-situ doping is attractive because the dopant distribution is uniform throughout the layer if the dopant is incorporated during and along with the deposition or growth of epitaxial layer 106. Epitaxial layer 106 may be, for example, approximately 0.1 to approximately 2 microns thick with a doping concentration within a range of approximately $10^{14}$ atoms per $cm^3$ to approximately $10^{17}$ atoms per $cm^3$.

According to an illustrative embodiment of the present invention, collector region 110 may be formed in a predefined region of epitaxial layer 106. Both collector region 110 and buried sub-collector region 104 may be substantially surrounded by isolation regions 108, as depicted in FIG. 1. Collector region 110 may be formed so that it overlies a portion 116 of sub-collector region 104. Collector region 110 may be formed by implanting ions of n-type into a portion of epitaxial layer 106 that overlies portion 116 of sub-collector region 104. Collector region 110 may be formed using conventional ion implantation conditions well known to those skilled in the art. A representative implant that can be employed may have ion doping concentration within a range of approximately $10^{17}$ atoms per $cm^3$ to approximately $10^{19}$ atoms per $cm^3$. Isolation regions 108 may be formed or created by following any of well-known techniques to form shallow trench insulation (STI) regions. For example, one technique may include first depositing a passivation layer (not shown), for example, a photo-resistant layer, and developing a photo-mask from the photo-resistant layer to cover at least collector region 110 and some portions of epitaxial layer 106, creating openings for the isolation regions 108 through, for example, a reactive-ion-etching (RIE) process, and depositing a dielectric material, such as oxide, into the openings to form or create isolation regions 108. The deposition of dielectric material may be followed subsequently by, for example, a chemical-mechanical-polishing (CMP) process to planarize a top surface of isolation regions 108 and removing the passivation layer to form the structure as shown in FIG. 1. It should be noted that isolation regions 108 may be formed so that at least a portion 112 of at least one isolation region 108 extends into the semiconductor substrate 102 above a portion 114 of sub-collector region 104, as shown in FIG. 1. The method step described above forms a buried sub-collector with reduced length, within a range of approximately 0.05 microns to approximately 0.5 microns. In a conventional prior art HBT, buried sub-collector region 104 typically extends laterally from approximately 0.2 to approximately 2 microns.

Figure 2:
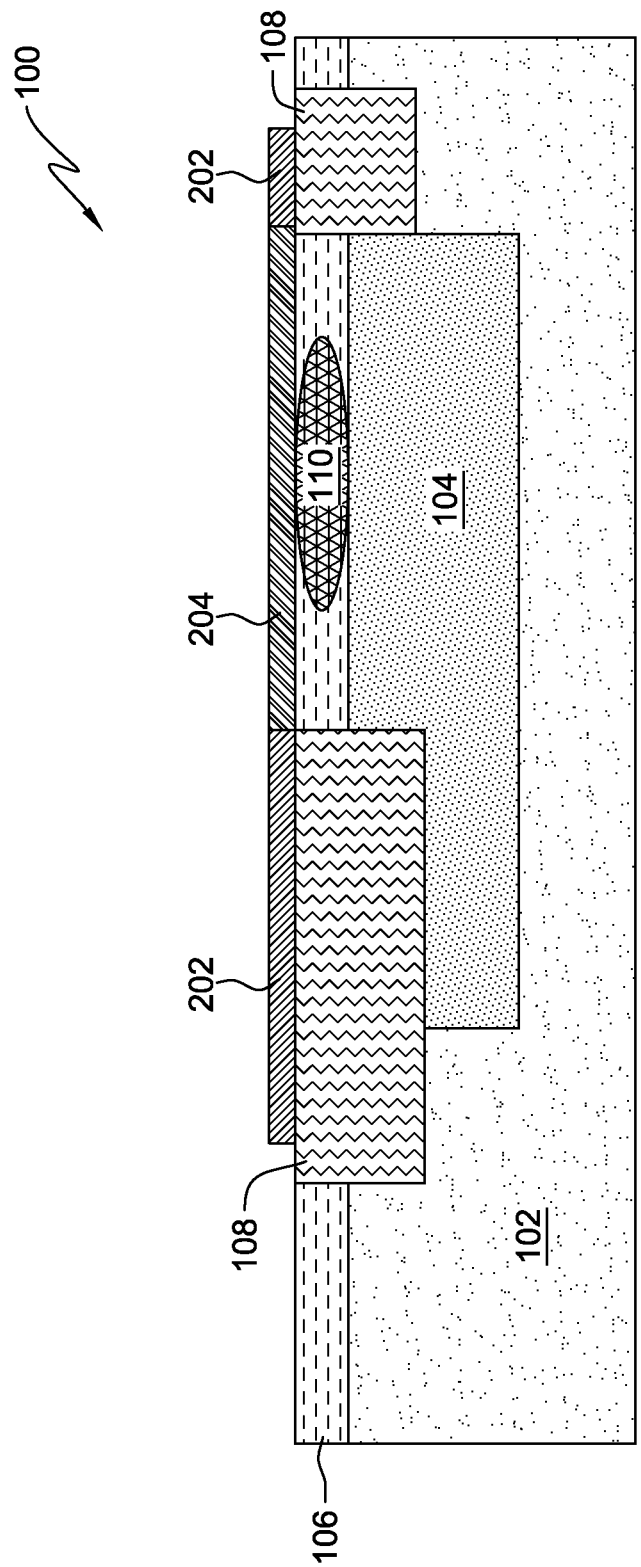

FIG. 2 illustrates that an intrinsic base layer 204 may be formed on a top surface of collector region 110. Intrinsic base layer 204 may be a single crystal low temperature epitaxial (LTE) layer of semiconductor material, such as silicon (Si), or semiconductor compound alloy such as SiGe. Intrinsic base layer 204 may be grown epitaxially on the surface of the collector region 110 using, for example, a chemical vapor deposition (CVD) process. Intrinsic base layer 204 may have a thickness from approximately 30 nm to approximately 300 nm with concentration of Ge varying from approximately 5% to approximately 40%. Intrinsic base layer 204 may be intrinsically doped with a P-type dopant, such as, but not limited to, boron (B). Intrinsic base layer 204 may be created such that it covers at least a portion of top surface of collector region 110. Collector region 110, including intrinsic base layer 204 may form part of the active region of HBT 100, and may therefore be referred to hereinafter as active region.

During growth of intrinsic base layer 204, a polysilicon layer 202 may be grown over top surfaces of isolation regions 108. This polysilicon layer 202 is generally referred to as extrinsic base layer. Extrinsic base layer 202 may have a thickness from approximately 15 nm to approximately 150 nm. Extrinsic base layer 202 may be highly doped having a dopant concentration from approximately $5 \times 10^{18}$ atoms per $cm^3$ to approximately $1 \times 10^{21}$ atoms per $cm^3$. The P+ polysilicon material used in this step of the present invention may contain germanium (Ge).

Figure 3:
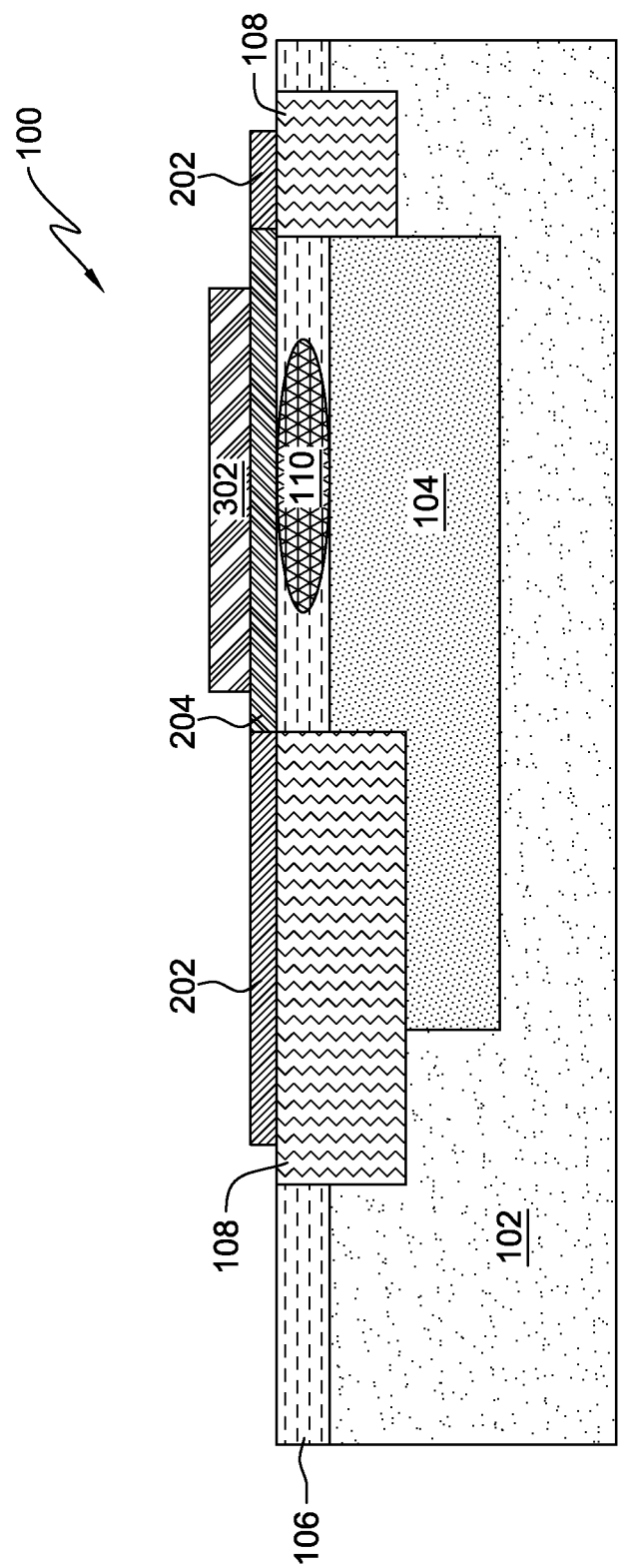

As shown in FIG. 3, a first insulator layer 302 may be formed next on the surface of intrinsic base layer 204, according the present embodiment of a method of HBT fabrication. First insulator layer 302 may include, for example, high temperature oxide (HTO) or any other suitable dielectric material. In FIG. 3, first insulator layer 302 functions as a protective layer for intrinsic base layer 204.

Figure 4:
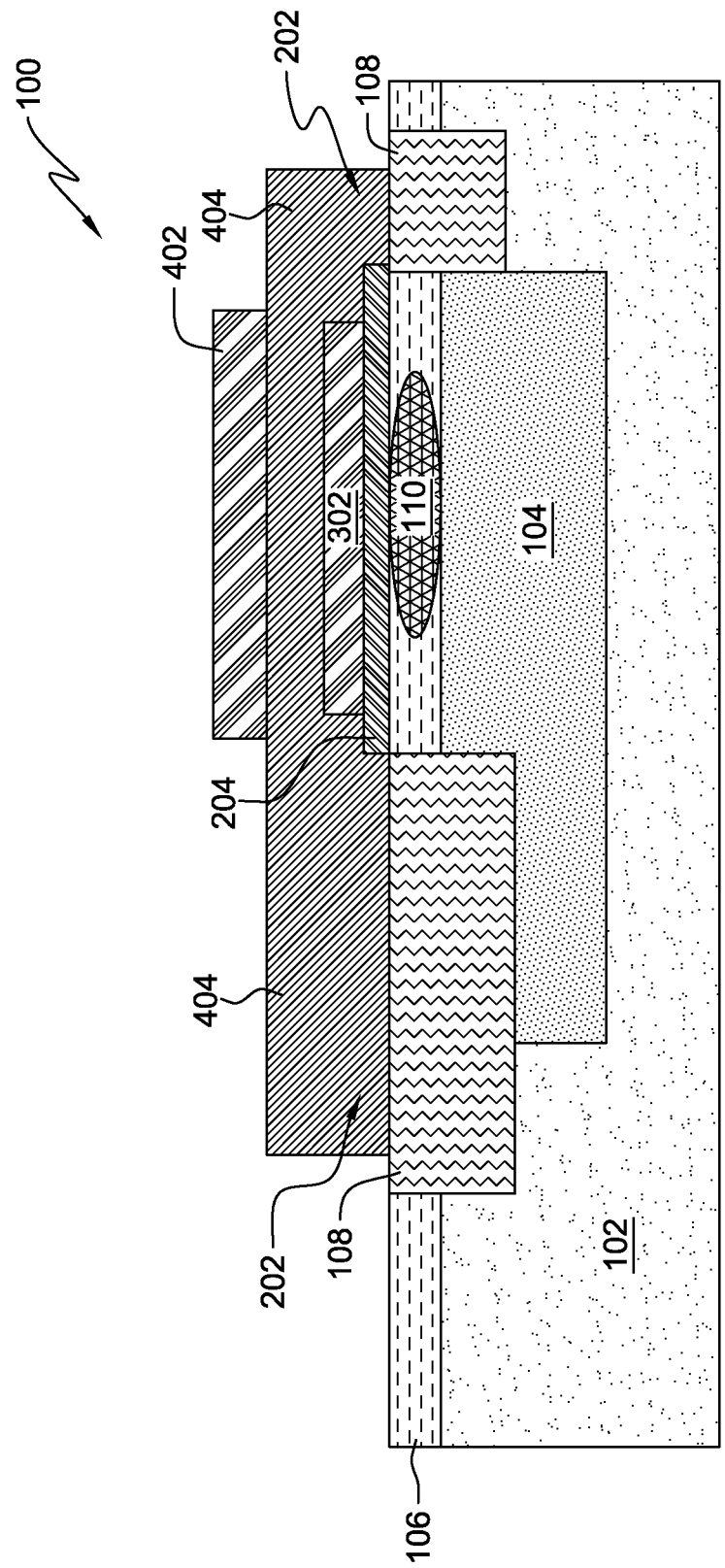

Referring to FIG. 4, additional in-situ P+ doped polysilicon material may be formed over previously created extrinsic base regions 202, exposed portions of intrinsic base layer 204 and first insulator layer 302 to form a raised extrinsic base layer 404. Raised extrinsic base layer 404 may be deposited or grown by conventional in-situ doping deposition or growth processes. It should be noted that extrinsic base regions 202 may form parts of the raised extrinsic base layer 404, and may therefore be referred to hereinafter as raised extrinsic base layer 404. The P+ polysilicon material used in this step of the illustrative embodiment may also contain germanium (Ge). In accordance with various embodiments of the present invention raised extrinsic base layer 404 may have a thickness of approximately 50 nm to approximately 200 nm. Raised extrinsic base layer 404 may then be patterned to form a structure shown in FIG. 4.

FIG. 4 further illustrates that following the creation of raised extrinsic base layer 404 current embodiment of a method of HBT fabrication may include forming a second insulator layer 402 over at least a portion of raised extrinsic base layer 404 overlying the first insulator layer 302 and intrinsic base layer 204. Second insulator layer may comprise one or more dielectric films, such as, for example, but not limited to, silicon dioxide ($SiO_2$) and silicon nitride (SiN). First insulator layer 302 and second insulator layer 402 insulate the raised extrinsic base 404 from subsequently formed emitter.

Figure 5:
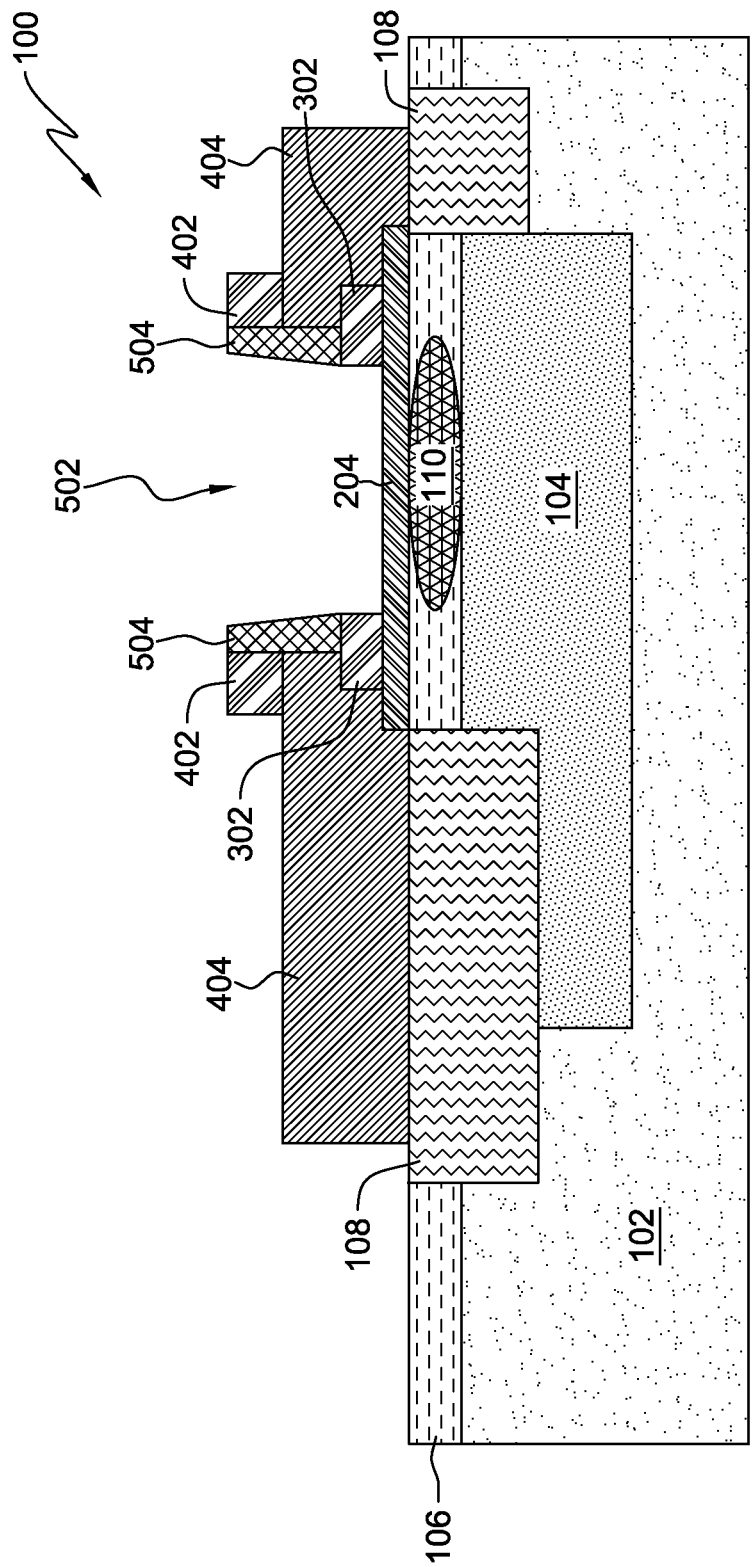

As shown in FIG. 5, a next step may include forming an emitter opening 502 by selectively removing portions of raised extrinsic base layer 404 and second insulator layer 402 to expose first insulator layer 302. Emitter opening 502 may be formed in a conventional fashion by, for example, depositing an emitter window mask, patterning and etching. The etching may be any conventional etching such as RIE. FIG. 5 also shows another step that may be included in the present embodiment of HBT fabrication method—forming spacers 504 along sidewalls of emitter opening 502. Spacers 504 may comprise any now known or later developed spacer material such as silicon nitride (SiN). Next, as also shown in FIG. 5, first insulator layer 302 is selectively removed inside emitter opening 502 only. The removal step may include conducting a wet etch of the HTO inside emitter opening 502.

Figure 6:
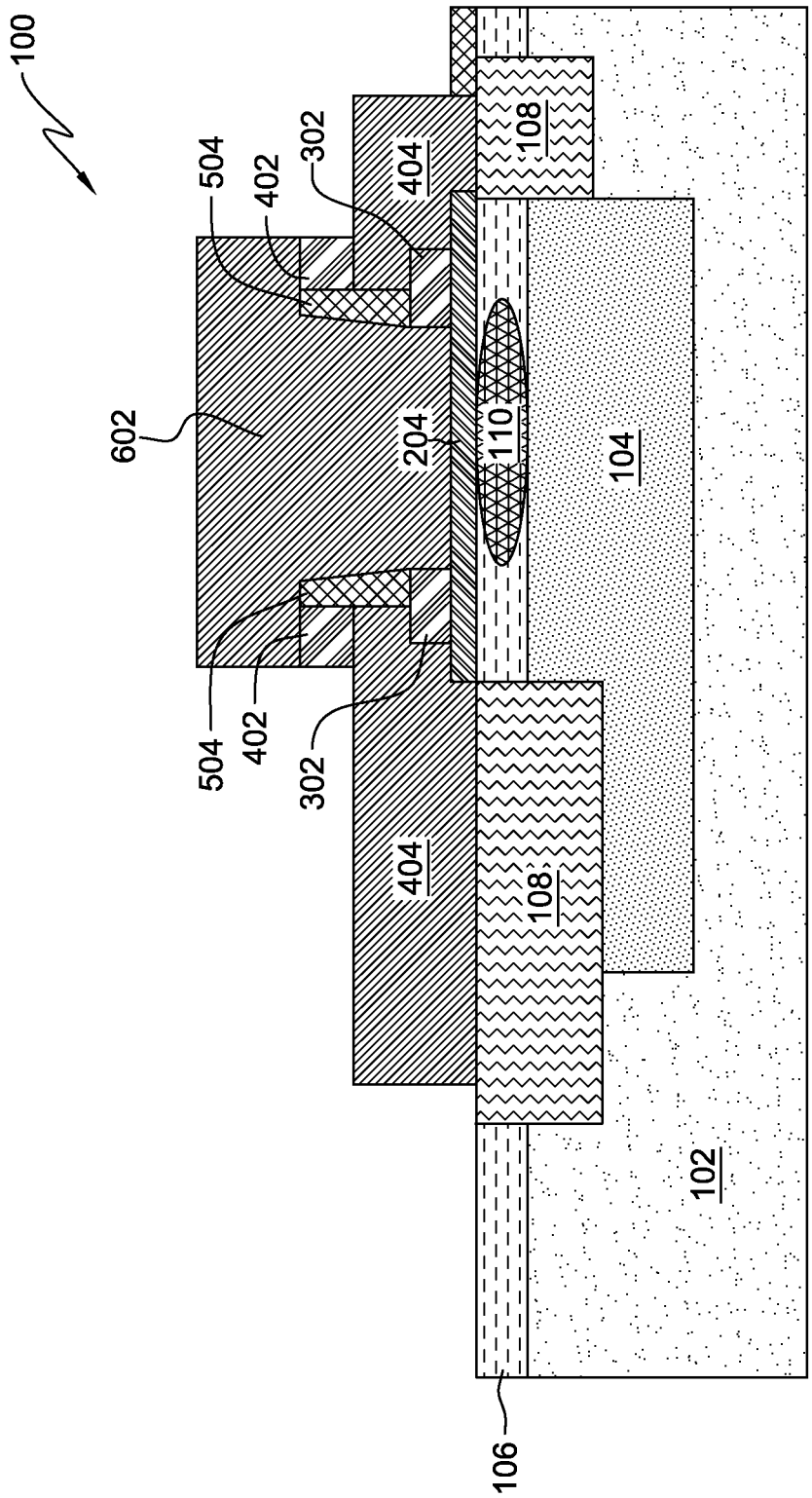

As shown in FIG. 6, a next step may include forming an emitter 602 in emitter opening in any now known or later developed manner. According to an illustrative embodiment, emitter 602, similarly to raised extrinsic base layer 404, may be made of conductive materials including, for example, polysilicon. Polycrystalline silicon (Si) may be deposited on the top surface of and in contact with intrinsic base layer 204 in emitter opening 502 (shown in FIG. 5). Emitter 602 may be formed by conventional deposition processes such as CVD with in-situ doping (n-type). Emitter 602 may be formed to have a thickness of between approximately 0.05 microns and approximately 0.2 microns. In the embodiment shown in FIG. 6 emitter 602 and raised extrinsic base 504 are separated by sidewall spacers 504 as well as first insulator layer 302 and second insulator layer 402. According to the present embodiment, an upper portion of emitter 602 overlies the top surfaces of spacers 504 and second insulator layer 402.

It should be noted that in some embodiments (not shown), a method of HBT fabrication may include, following the creation of raised extrinsic base layer 404, depositing a layer of metal (such as nickel) covering top surface of raised extrinsic base layer 404. The metal layer may be used to form silicided raised extrinsic base layer for increased conductivity of raised extrinsic base layer 404. A person skilled in the art may appreciate that the silicidation process includes an annealing process.

Figure 7:
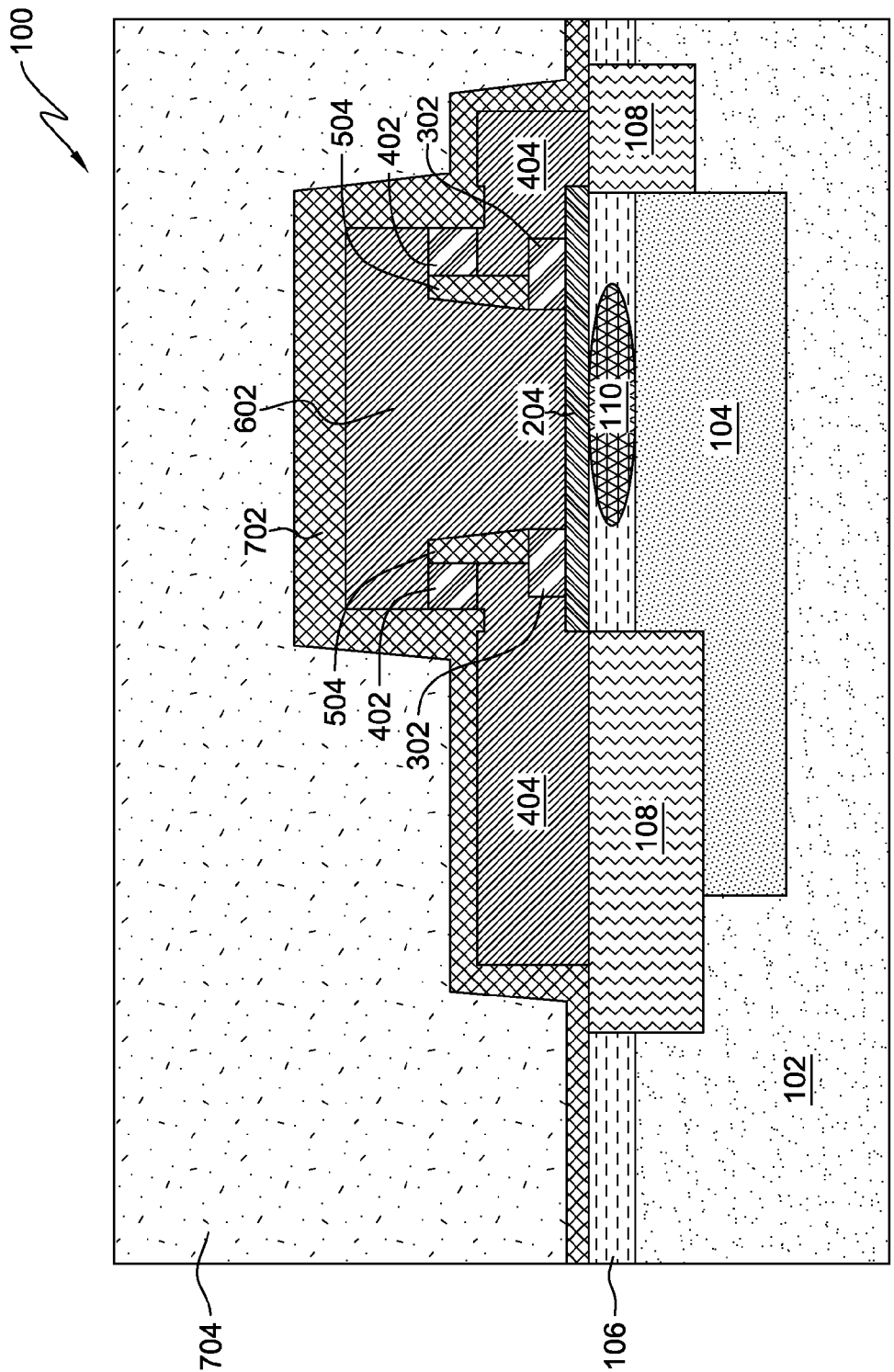

FIG. 7 illustrates that a protective layer 702 may next be formed to cover emitter 602, raised extrinsic base layer 404, exposed portion of isolation regions 108, and exposed portion of epitaxial layer 106. Protective layer 702 may be a layer of silicon nitride (SiN) that may be applied to protect polysilicon of emitter 602 and raised extrinsic base layer 404 from erosion during a subsequent formation of contact openings. However, the invention is not limited in this respect and other protective materials may be used. In some embodiments, protective layer 702 may not be used at all.

Still referring to FIG. 7, an interlevel dielectric (ILD) layer 704, preferably comprising borophosphosilicate glass (BPSG), may be deposited over protective layer 702 with a CVD process. In various embodiments, interlevel dielectric layer 704 is deposited to electrically insulate HBT device 100 from a subsequently deposited overlying metal layer.

Figure 8:
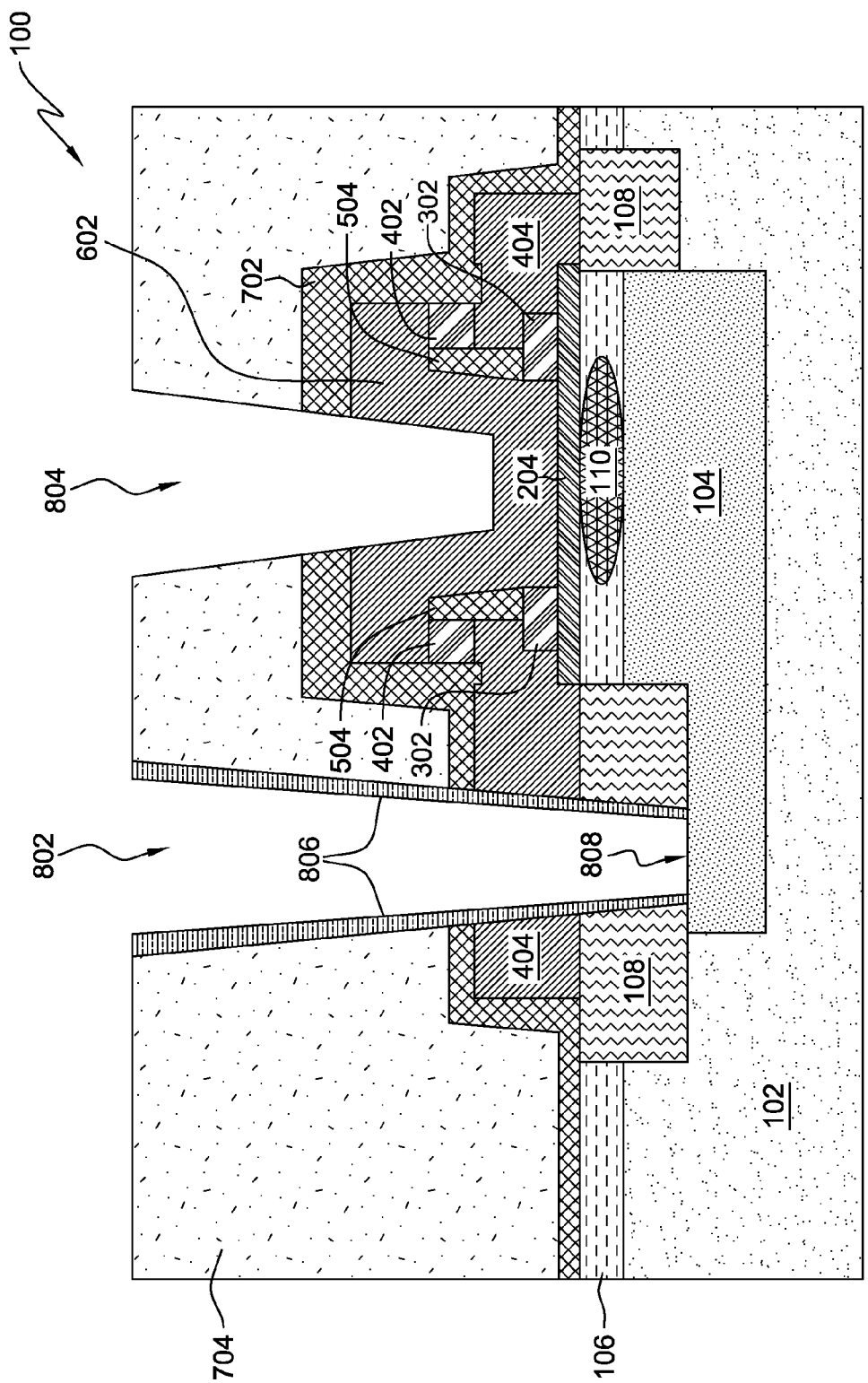

FIG. 8 illustrates that the present embodiment of a method of fabrication may include forming electrical contacts (vertical contact vias) to emitter 602, raised extrinsic base layer 404 (shown in FIG. 10) and buried sub-collector region 104. The formation may include creating openings 804 and 802 inside ILD layer 704 that extend to the top portion of emitter 602 and to the buried sub-collector region 104, respectively. The openings 802, 804 may be created by any conventional etching processes, such as, for example, a conventional photolithography process using a plurality of masks. Etching collector contact via 802 may include etching through the ILD layer 704, protective layer 702, raised extrinsic base layer 404 and through a portion of isolation region 108 down to buried sub-collector layer 104. Etching emitter contact via 804 may include etching through the ILD layer 704 and protective layer 702 down to emitter 602. It should be noted that the formation of openings 802 and 804 may comprise two separate processing steps that employ two different masks. As illustrated in FIG. 8, there may also be a layer of insulating material 806 covering sidewalls of collector contact opening (via) 802. Insulating layer 806 may be deposited on sidewalls of via 802 to prevent diffusion of subsequently deposited conductive material. In this exemplary embodiment, insulating material 806 may be deposited prior to formation of emitter contact via 804. In various embodiments, insulating material layer 806 may comprise an oxide (silicon oxide), nitride (silicon nitride) or any other suitable insulating material. Insulating material 806 may be removed from the bottom portion 808 of the collector contact opening 802.

Figure 9:
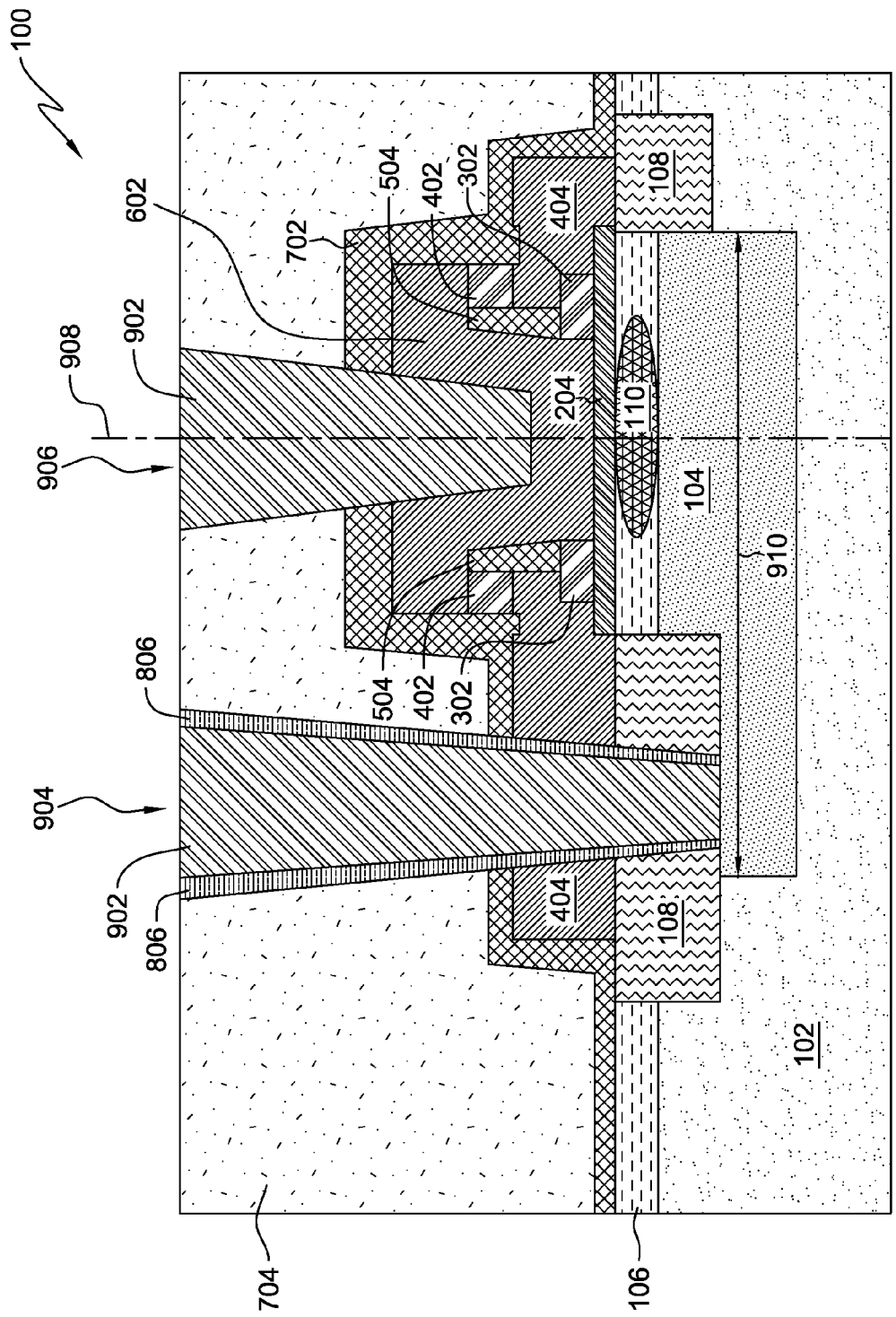

As illustrated in FIG. 9, collector contact opening and emitter contact opening may then be filled with a conductive material 902 to form a collector contact 904 and an emitter contact 906. The conductive material may include a material such as a metal (for example, but not limited to, tungsten, aluminum, copper), a metal alloy, a silicide, a conductive metal nitride, a conductive metal oxide, silicon, or the like.

At this stage of the process, a heterojunction bipolar transistor 100 structure has been formed in accordance with an embodiment of the present invention. As shown in FIG. 9, intrinsic base 204 and collector 110 may be part of an active region which may be contacted by a buried layer of sub-collector region 104. Sub-collector region 104 of first conductivity type (for example, N+ doped) in a single crystal semiconductor substrate 102 (for example, P-type-Si substrate) may be substantially surrounded by isolation regions 108. Intrinsic base layer 204 of epitaxial semiconductor material of second conductivity type may be located on top of the collector region 110. Raised extrinsic base layer 404 adjacent to and electrically connected to intrinsic base layer 204 may comprise polysilicon formed over isolation regions 108. Emitter 602 of the first conductivity type may comprise a doped polysilicon. Raised extrinsic base layer 404 substantially encloses intrinsic base layer 204 and most of the emitter 602, though it is separated from emitter 602 by at least insulator spacers 504.

FIG. 9 also illustrates that electrical connection to HBT 100 may be made through one or more contacts 904, 906. For example, emitter contact 906 may be in contact with a top section (or surface) of emitter 602. Electrical connection to collector 110 may be made through collector contact 904 and buried sub-collector 104. Emitter contact 906, base contact 1002 (shown in FIG. 10) and collector contact 904 comprise a conductive material 902, for example, but not limited to, tungsten (W) formed into the vias. Collector contact 904 may have insulating layer 806 deposited on its sidewalls. As illustrated in FIG. 9, collector contact 904 extends through at least a portion of the raised extrinsic base layer 404 and isolation region 108. Buried sub-collector region 104 in the illustrative embodiment provides a horizontal conductive pathway from beneath collector 110 to collector contact 904, which provides a vertical conductive pathway to a top surface of HBT 100. A person skilled in the art will appreciate that $f_T$, also known in the art as unit-gain cutoff frequency, may be enhanced by achieving faster electron transport within buried sub-collector region 104. According to the illustrative embodiment depicted in FIG. 9, faster electron transport may be accomplished by placing collector contact 904 proximate to a vertical center line 908. Vertical center line 908 substantially passes through the center of HBT device 100. In various exemplary embodiments, the distance between collector contact 904 and center line 908 may be in a range of approximately 0.03 microns to approximately 0.8 microns. Consequently, a length 910 of the substantially horizontal portion of sub-collector 104 may be in a range of approximately 0.1 to approximately 0.5 microns. A person skilled in the art will appreciate that a parasitic collector base capacitance $C_{cb}$ can be advantageously reduced by the reduction in length of sub-collector region 104, as discussed below in conjunction with FIG. 11.

Figure 10:
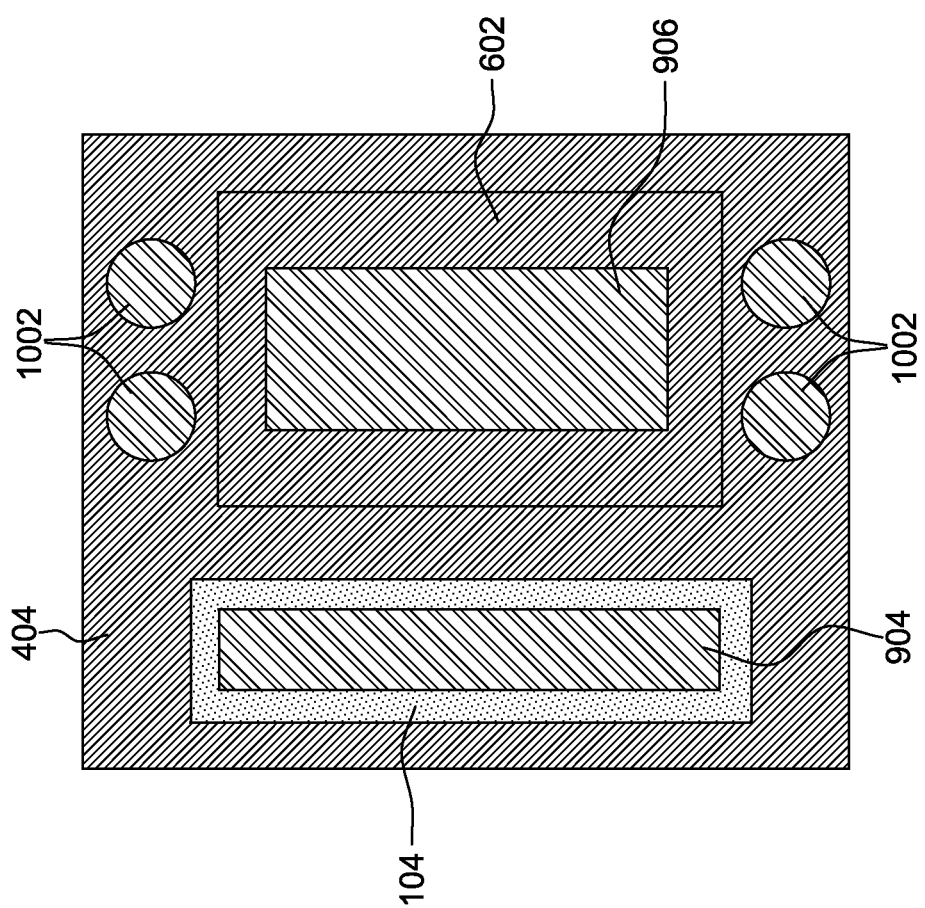
FIG. 10 illustrates a top view of the heterojunction bipolar transistor of FIG. 9.

FIG. 10 shows a top view of the heterojunction bipolar transistor of FIG. 9. It shall be noted that although the demonstrative illustration of an embodiment depicted in FIG. 10 shows raised extrinsic base layer 404 and emitter 602 having a rectangular shape, this invention is not so limited. A person of ordinary skill will appreciate that emitter 602 and raised extrinsic base 404 may have a ring-type shape such as, for example, a circle or an oval. In addition, even though some elements, such as contacts to base 1002, are illustrated as two or more separate members, they may in fact represent a single member of the HBT device 100. It will be apparent to a person of ordinary skill in the art that ILD layer 704 and protective layer 702 overlying emitter 602 and raised extrinsic base 404 are not shown in FIG. 10 for ease of illustration. Furthermore, it will be apparent to a person of ordinary skill in the art that buried sub-collector region 104 is formed underneath collector contact 904 and underneath the raised extrinsic base layer 404 of the HBT structure 100. As previously indicated, raised extrinsic base layer 404 may have a silicided top surface.

Figure 11:
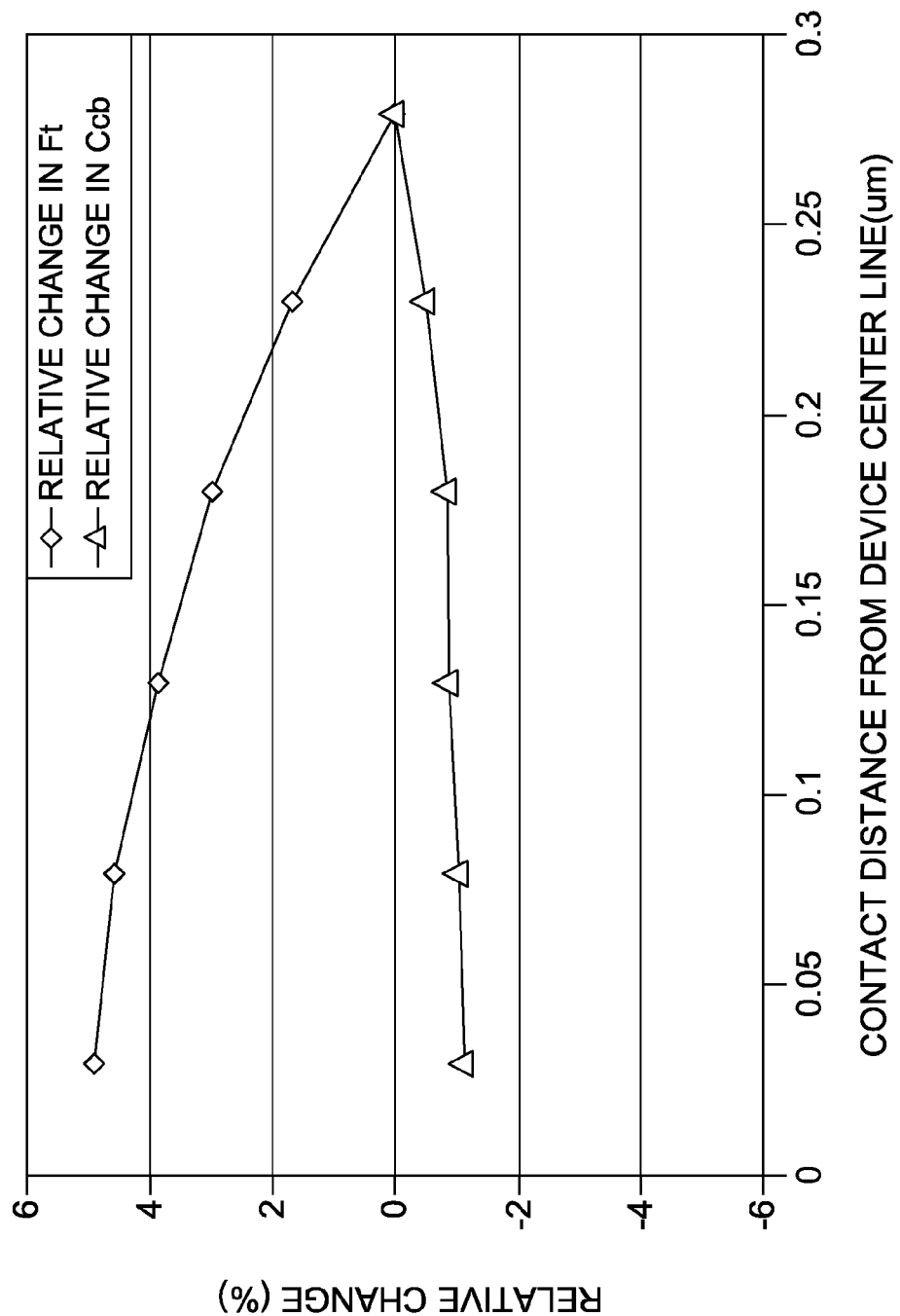
FIG. 11 is a graph that shows relationship between the collector contact position and a relative change in device performance.

FIG. 11 is a graph that shows the effects of changing the distance between a center line (not shown) of collector contact 904 and HBT device center line 908 on various device performance characteristics. The speed at which HBT 100 can switch is referred to as the cutoff frequency ($f_T$). As previously indicated, the switching speed of a circuit is typically directly controlled by $f_T$ of the HBT device. It is likewise noted that to increase the performance of an HBT, it is desirable to increase both the cutoff frequency and the maximum operating frequency ($f_{max}$). $F_{max}$ is a function of $f_T$, parasitic resistances and parasitic capacitances between elements of the transistor according to the formula:

$$f=(f_T/8\pi {}^*C_{cb}{}^*R_b)^{1/2},$$

wherein $R_b$ represents base resistance and $C_{cb}$ represents collector base capacitance.

FIG. 11 demonstrates that changing collector contact 904 distance from device center line 908 has substantial effect on both the cutoff frequency $f_T$ and collector base capacitance $C_{cb}$ of HBT 100. As used herein, "collector contact distance from device center line", refers to the distance between a center line (not shown) of collector contact 904 and HBT device center line 908. For example, as shown in FIG. 11, reducing collector contact 904 distance from device center line 908 from 0.28 micron to 0.13 micron shows approximately 4% improvement in $f_T$ while $C_{cb}$ is reduced by approximately 1%. Similarly, changing collector contact 904 distance from device center line 908 from 0.28 micron to 0.03 micron shows approximately 5% improvement in $f_T$ while $C_{cb}$ is reduced by approximately 1.5%. It is noted that a typical distance between a collector contact and a device center line in a conventional prior art HBT is approximately 0.30 microns. Thus, as described above, reducing the distance between collector contact 904 and HBT center line 908 allows one to reduce the horizontal length of buried subcollector region 104. This advantageous change in structure, according to illustrative embodiments of the present invention, enables one to significantly reduce $C_{cb}$ while at the same time this reduction in distance significantly increases $f_T$ of HBT device 100.

Figure 12:
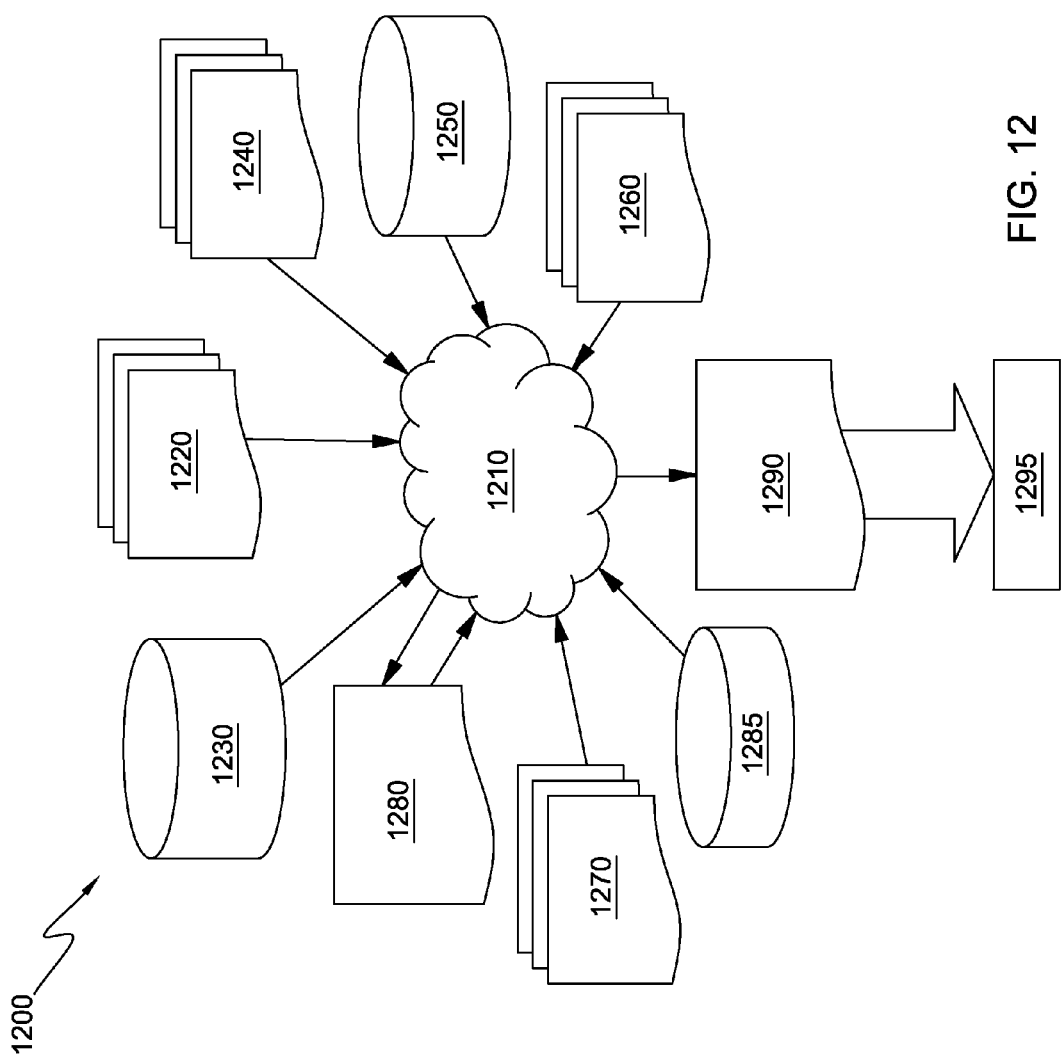
FIG. 12 is a flow diagram of a design process used in semiconductor design, manufacture, and/or test.

FIG. 12 shows a block diagram of an exemplary design flow 1200 used for example, in semiconductor IC logic design, simulation, test, layout, and manufacture. Design flow 1200 includes processes, machines and/or mechanisms for processing design structures or devices to generate logically or otherwise functionally equivalent representations of the design structures and/or devices described above and shown in FIGS. 1-11. The design structures processed and/or generated by design flow 1200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 1-11. As such, design structure 1220 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 1-11 to generate a netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In an embodiment, design structure 1290 may comprise a compiled, executable HDL simulation model that functionally simulates the devices shown in FIGS. 1-11.

Design structure 1290 may also employ a data format used for the exchange of layout data of integrated circuits and/or symbolic data format (e.g., information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 1290 may then proceed to a stage 1295 where, for example, design structure 1290 proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A heterojunction bipolar transistor structure comprising:
   a semiconductor substrate having a sub-collector region of a first conductivity type therein;
   a collector region of a first conductivity type overlying a first portion of the sub-collector region, the collector region having a lower impurity concentration than the sub-collector region;
   an intrinsic base layer of a second conductivity type overlying at least a portion of the collector region;
   an extrinsic base layer adjacent to and electrically connected to the intrinsic base layer;
   an isolation region extending vertically between the extrinsic base layer and a second portion of the sub-collector region, a collector contact extending through a portion of the isolation region, wherein the collector contact penetrates through the extrinsic base layer;
   an emitter of the first conductivity type overlying a portion of the intrinsic base layer; and
   the collector contact electrically connected to the sub-collector region, the collector contact extending through at least a portion of the extrinsic base layer.

2. The heterojunction bipolar transistor structure of claim 1, wherein the extrinsic base layer comprises a raised extrinsic base layer.

3. The heterojunction bipolar transistor structure of claim 1, wherein the heterojunction bipolar transistor comprises an npn transistor.

4. The heterojunction bipolar transistor structure of claim 1, wherein a length of a substantially horizontal portion of the sub-collector region ranges from approximately 0.05 to approximately 0.5 microns.

5. The heterojunction bipolar transistor structure of claim 1, wherein a distance between the collector contact and a center line of the heterojunction bipolar transistor ranges from approximately 0.1 microns to approximately 0.8 microns.

6. The heterojunction bipolar transistor structure of claim 1, wherein the emitter and the extrinsic base layer are separated by at least one insulator spacer.

7. The heterojunction bipolar transistor structure of claim 1, wherein the collector contact comprises a via filled with an electrically conductive material and having sidewalls of the via covered by a layer of insulating material.

8. The heterojunction bipolar transistor structure of claim 1, wherein at least a portion of at least one isolation region is formed in the semiconductor substrate above the second portion of the sub-collector region.

9. A method of forming a heterojunction bipolar transistor structure comprising:
   forming a sub-collector region of a first conductivity type within a semiconductor substrate;
   forming a collector region of a first conductivity type in the semiconductor substrate, wherein the collector region overlies a first portion of the sub-collector region and wherein the collector region has a lower impurity concentration than the sub-collector region;
   forming an isolation region substantially around the collector region and substantially around the first portion of the sub-collector region;
   forming an intrinsic base layer of a second conductivity type above at least a portion of the collector region;
   forming an extrinsic base layer adjacent to the intrinsic base layer, wherein the extrinsic base layer is electrically connected to the intrinsic base layer, a collector contact extending through a portion of the isolation region, wherein the collector contact penetrates through the extrinsic base layer;
   forming an emitter of the first conductivity type above a portion of the intrinsic base layer; and
   forming a collector contact, wherein the collector contact is electrically connected to the sub-collector region and wherein the collector contact extends through at least a portion of the extrinsic base layer.

10. The method of claim 9, wherein forming the extrinsic base layer comprises forming a raised extrinsic base layer.

11. The method of claim 9, wherein the heterojunction bipolar transistor comprises an npn transistor.

12. The method of claim 9, wherein a length of a substantially horizontal portion of the sub-collector region ranges from approximately 0.05 to approximately 0.5 microns.

13. The method of claim 9, wherein forming the collector contact comprises forming the collector so that a distance between the collector contact and a center line of the heterojunction bipolar transistor ranges from approximately 0.1 microns to approximately 0.8 microns.

14. The method of claim 9, further comprising forming at least one insulator spacer between the emitter and the raised extrinsic base layer.

15. The method of claim 9, wherein forming the collector contact comprises:
   forming a via having sidewalls;
   forming a layer of insulating material on the sidewalls of the via; and
   filling the via with an electrically conductive material.

16. The method of claim 9, wherein forming the isolation region comprises forming the isolation region so that at least a portion of the isolation region extends into the semiconductor substrate above a second portion of the sub-collector region.

17. A design structure for designing, manufacturing, or testing an integrated circuit, the design structure comprising:
   a semiconductor substrate having a sub-collector region of a first conductivity type therein;
   a collector region of a first conductivity type overlying a first portion of the sub-collector region, the collector region having a lower impurity concentration than the sub-collector region;
   an intrinsic base layer of a second conductivity type overlying at least a portion of the collector region;
   an extrinsic base layer adjacent to and electrically connected to the intrinsic base layer;
   an isolation region extending vertically between the extrinsic base layer and a second portion of the sub-collector region, a collector contact extending through a portion of the isolation region, wherein the collector contact penetrates through the extrinsic base layer;
   an emitter of the first conductivity type overlying a portion of the intrinsic base layer; and
   a collector contact electrically connected to the sub-collector region, the collector contact extending through at least a portion of the extrinsic base layer.

18. The design structure of claim 17, wherein the design structure comprises a netlist.

19. The design structure of claim 17, wherein the design structure resides on storage medium as a data format used for the exchange of layout data of integrated circuits.

20. The design structure of claim 17, wherein the design structure resides in a programmable gate array.

* * * * *